(12) United States Patent
Pagliato et al.

(10) Patent No.: US 8,724,361 B2
(45) Date of Patent: May 13, 2014

(54) DMA ARCHITECTURE FOR NAND-TYPE FLASH MEMORY

(76) Inventors: Mauro Pagliato, Agrate Brianza (IT);
Giulio Martinozzi, Agrate Brianza (IT);
Francesco Pessina, Agrate Brianza (IT)

( * ) Notice: Subject to any disclaimer, the term of this patent is extended or adjusted under 35 U.S.C. 154(b) by 269 days.

(21) Appl. No.: 13/364,971

(22) Filed: Feb. 2, 2012

(65) Prior Publication Data
US 2013/0201744 A1 Aug. 8, 2013

(51) Int. Cl.
*G11C 5/06* (2006.01)

(52) U.S. Cl.
USPC ............................ 365/63; 365/189.2; 365/201

(58) Field of Classification Search
USPC .................. 365/63, 189.011, 189.15, 189.17, 365/189.02, 189.05, 201
See application file for complete search history.

(56) References Cited

U.S. PATENT DOCUMENTS 5,590,073 A * 12/1996 Arakawa et al. ......... 365/185.08
6,122,197 A * 9/2000 Sinai et al. ............... 365/185.22
6,577,528 B2 * 6/2003 Gogl et al. .................... 365/158
7,353,326 B2    4/2008 Cho et al.
7,715,271 B1 * 5/2010 Yu et al. ........................ 365/231

OTHER PUBLICATIONS

"Flash Memories", by Paulo Capelletti, et al., 1999, Kluwer Academic Publishers, Boston.

* cited by examiner

*Primary Examiner* — Vanthu Nguyen
(74) *Attorney, Agent, or Firm* — McGinn IP Law Group, PLLC

(57) ABSTRACT

A device includes a nonvolatile memory array, a Static Random Access Memory (SRAM) array including a plurality of bit lines, including first and second bit lines paired with each other, and a pad. A first circuit is coupled between the nonvolatile memory array and the first and second bit lines, and interfaces with the SRAM array. A second circuit is coupled between the pad and the first and second bit lines, and interfaces with the SRAM array. A control circuit performs a first operation to access the nonvolatile memory array via the SRAM array and the first and second circuits and performs a second operation by producing an electrical path connecting from the pad to the nonvolatile memory array through at least one of the first and second bit lines of the SRAM array without intervening at least one of the first and second circuits.

20 Claims, 12 Drawing Sheets

1100

DMA ARCHITECTURE FOR NAND-TYPE FLASH MEMORY

BACKGROUND OF THE INVENTION

1. Field of the Invention

The present invention generally relates to testing a flash memory device using Direct Memory Access (DMA). More particularly, analog multiplexer structures of an SRAM matrix permit complementary SRAM bit lines having leakage effects that cancel each other to be selected, to provide a DMA path to selected cells of a NAND matrix, from the I/O pads of the device through a page buffer of the NAND matrix, to permit testing of the NAND matrix cells and bit line leakage.

2. Description of the Related Art

Direct Memory Access (DMA) is a technique commonly used in the art to measure cell current in a flash memory array and to evaluate bit-line leakage.

For example, as described on pages 451-452 of the text "Flash Memories" by Paulo Cappelletti, et al., a pass transistor bypasses a sense amplifier, which allows the direct access from an I/O pad to a selected bit-line. DMA allows the direct access from the I/O pad to the selected bit line. The sense amplifier circuit is disabled and an output buffer is tri-stated. Power supply voltage Vpp can then be applied, through the row decoder, to cell gates in a manner that permits a wide range of addressed cells to be selectively activated for testing. The scheme is repeated systematically for all the 8, 16 (or more) I/O pins. The characteristic of each individual cell inside the array can be observed on the I/O pins.

This DMA technique can be used to monitor the typical cell's current, for production control and/or for process/product characterization. A tight distribution of the cell currents inside the array, after ultraviolet (UV) erase, electrical erase, or after programming, is a key issue for a flash device and is commonly used for evaluation of a new process and process changes.

However, a limitation of this conventional DMA method is the intrinsic slowness of the tester's parametric units, typically tens of milliseconds. To better exploit this capability, some flash testers feature fast parallel parametric units, e.g., one unit per I/O, that allow measuring the currents of 16 cells, in parallel, in a few milliseconds. Nevertheless, measuring a full cell current distribution for a large flash memory may require hours of test time.

SUMMARY OF THE INVENTION

According to a first exemplary aspect of the invention, a device includes a memory circuit including a memory cell and a bit line coupled to the memory cell, a first node, a first interface circuit coupled between the first node and the bit line of the memory circuit and including a first sense circuit that senses data stored in the memory cell to drive the first node, a second node, a second interface circuit coupled between the second node and the bit line of the memory circuit and including a second sense circuit that senses the data stored in the memory cell to drive the second node, and a first transistor coupled in parallel to the first interface circuit to form, when rendered conductive, a first bypass path between the bit line of the memory circuit and the first node.

According to a second exemplary aspect of the invention, a device comprises a nonvolatile memory array including a Static Random Access Memory (SRAM) array including a plurality of bit lines including first and second bit lines paired with each other, a first circuit coupled between the nonvolatile memory array and the first and second bit lines, and configured to interface with the SRAM array, a pad, a second circuit coupled between the pad and the first and second bit lines, and configured to interface with the SRAM array, a control circuit configured to perform a first operation to access the nonvolatile memory array via the SRAM array and the first and second circuits, and perform a second operation by producing an electrical path connecting from the pad to the nonvolatile memory array through at least one of the first and second bit lines of the SRAM array, without intervening at least one of the first and second circuits.

According to yet another exemplary aspect of the invention, a device comprises a nonvolatile memory cell, a bit line coupled to the memory cell, a page buffer coupled to the bit line, a SRAM coupled to the page buffer, a terminal coupled to the SRAM, and a circuit configured to provide a current path between the bit line and the terminal via a portion of a wire included in the SRAM under a condition where the SRAM is inactivated.

DETAILED DESCRIPTION OF EXEMPLARY EMBODIMENTS OF THE PRESENT INVENTION

Figure 1:
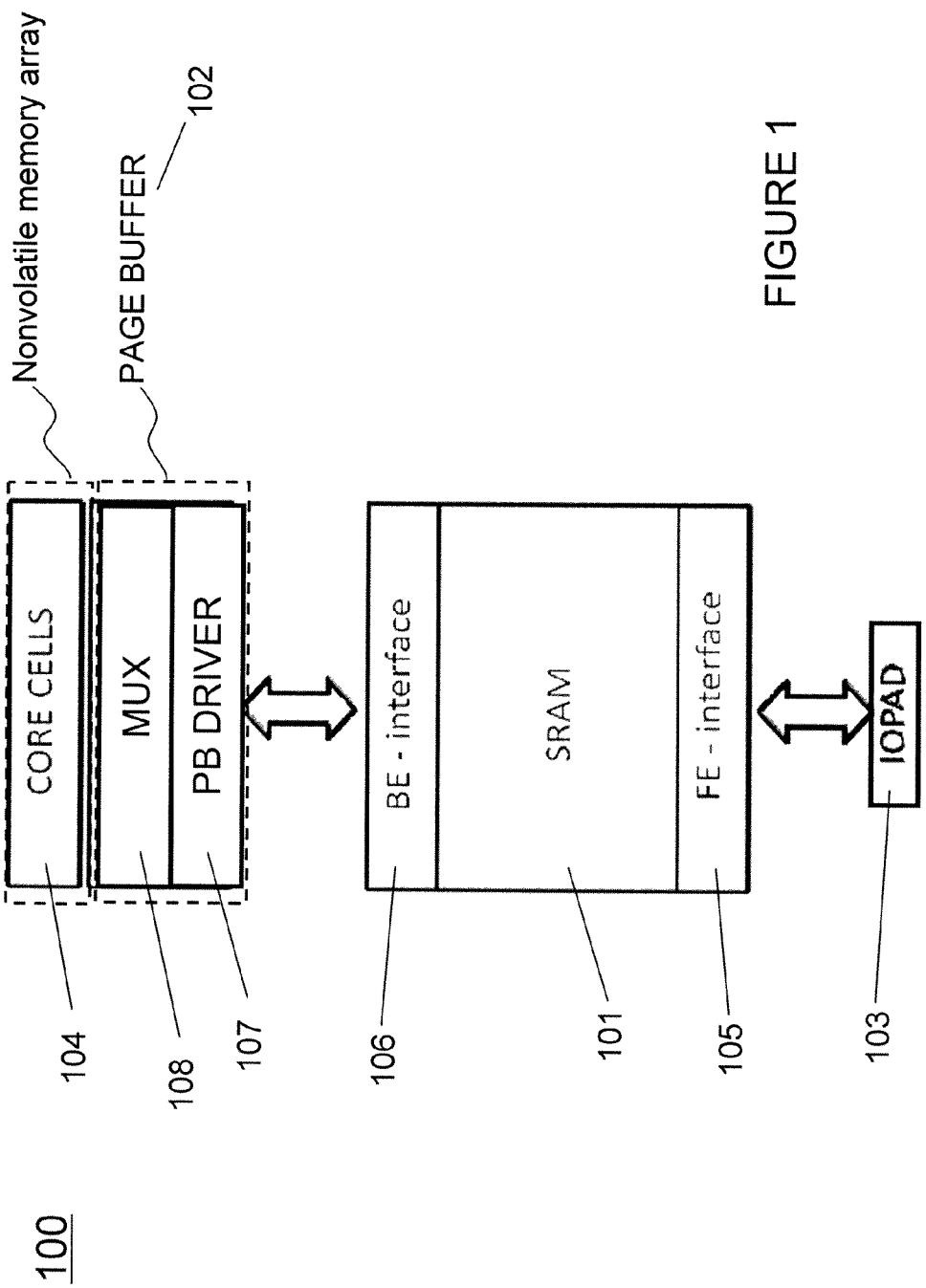
FIG. 1 shows a NAND flash memory configuration 100 of an exemplary embodiment of the present invention.

Referring now to the drawings, and more particularly to FIGS. 1-11, exemplary embodiments will now be described.

It is noted that the present inventors have first recognized that the conventional flash memory architecture has a problem in that aggressive scaling in NAND-type memory and short time-to-market require implementation of advanced techniques for process characterization and failure analysis.

The present invention exemplarily uses a new implementation of a structure that allows the DMA (Direct Memory Access) of an entire block of an array, in order to measure current cell and bit-line leakage in a NAND-type flash memory, by using a SRAM block for interfacing with the NAND-type flash memory blocks during DMA testing, thereby speeding up the DMA-based testing of a NAND memory device.

The new DMA technique of the present invention uses a NAND-type memory architecture 100 exemplarily shown in FIG. 1, that includes an (e.g., entire) static random access memory (SRAM) matrix 101 and is based on the full reuse of the SRAM bit-lines multiplexing in the DMA path from page buffer 102 to the I/O pads 103. By reusing the analog multiplexer structures of the SRAM, there is no extra area impact and minimum extra control logic to enable the DMA path.

FIG. 1 exemplarily shows the SRAM matrix 101 followed by simple page buffers 102 to drive core cells 104. The digital data path to write the core cells 104 may be performed in two steps: first, the SRAM 101 is loaded with a desired pattern from the IO pad 103 through the "Front End" (FE) interface 105; and, second, data are transferred from SRAM 101 to page buffers 102 through the "Back End" (BE) interface 106. The page buffer 102 then drives the core cells 104, using page buffer driver 107 and multiplexer 108. In the read operation, data are transferred through the reverse path (page buffers 102 to SRAM 101 and SRAM 101 to the IO pad 103.

Figure 2:
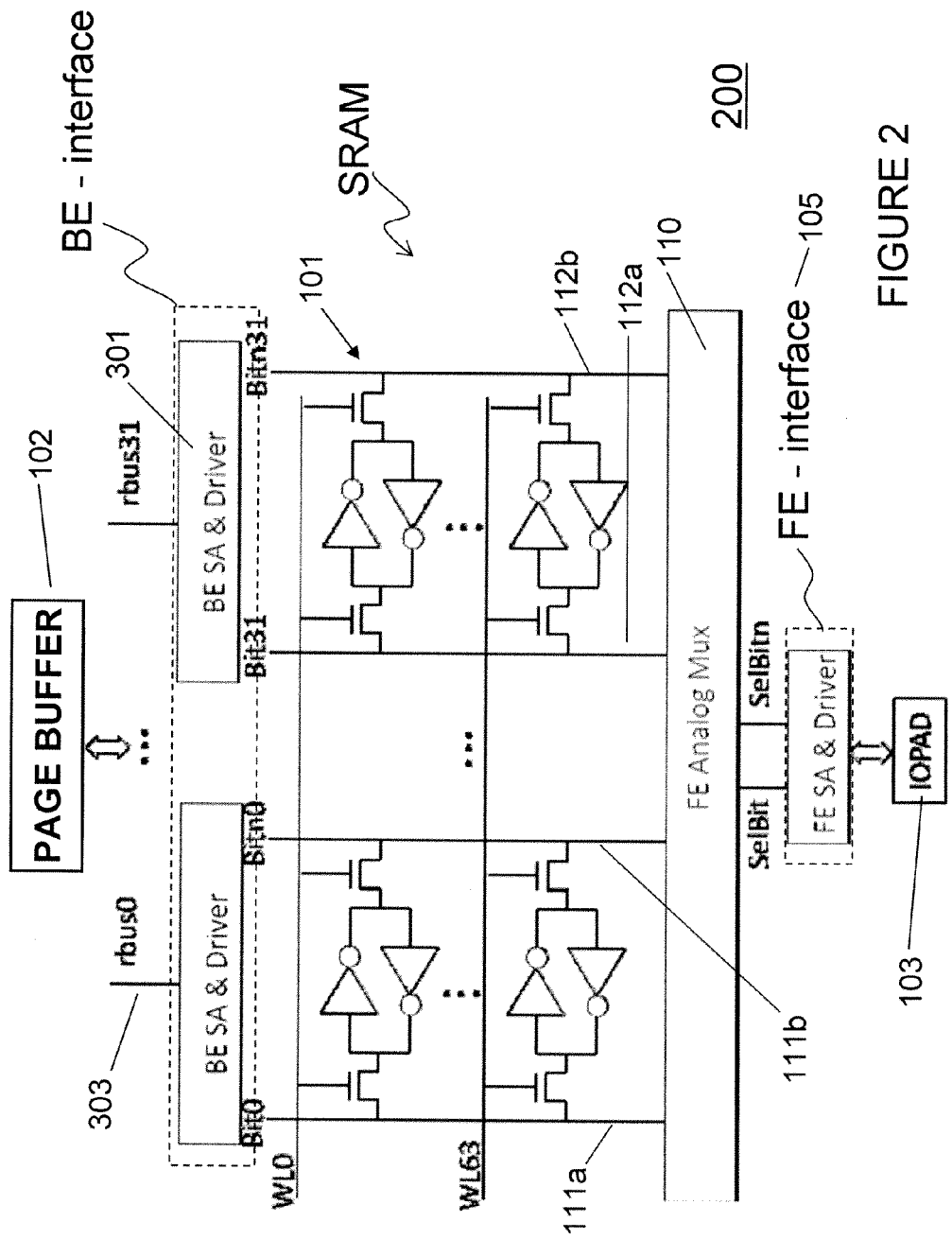
FIG. 2 shows an SRAM matrix portion 200 of the exemplary embodiment.

A basic structure 200 of the SRAM 101 is exemplarily shown in FIG. 2. The FE interface 105 has low parallelism and controls data transfer from/to the IO pad 103. The FE sense amplifier (SA) and the FE driver are the major blocks involved respectively in read/write SRAM operations. An FE analog multiplexer 110 selects a pair of SRAM bit-lines 111a/111b, 112a/112b. In the example used to explain an exemplary embodiment of the present invention, a 64-bit word line (WL)×32 pairs of bit-lines SRAM is demonstrated.

Figure 3:
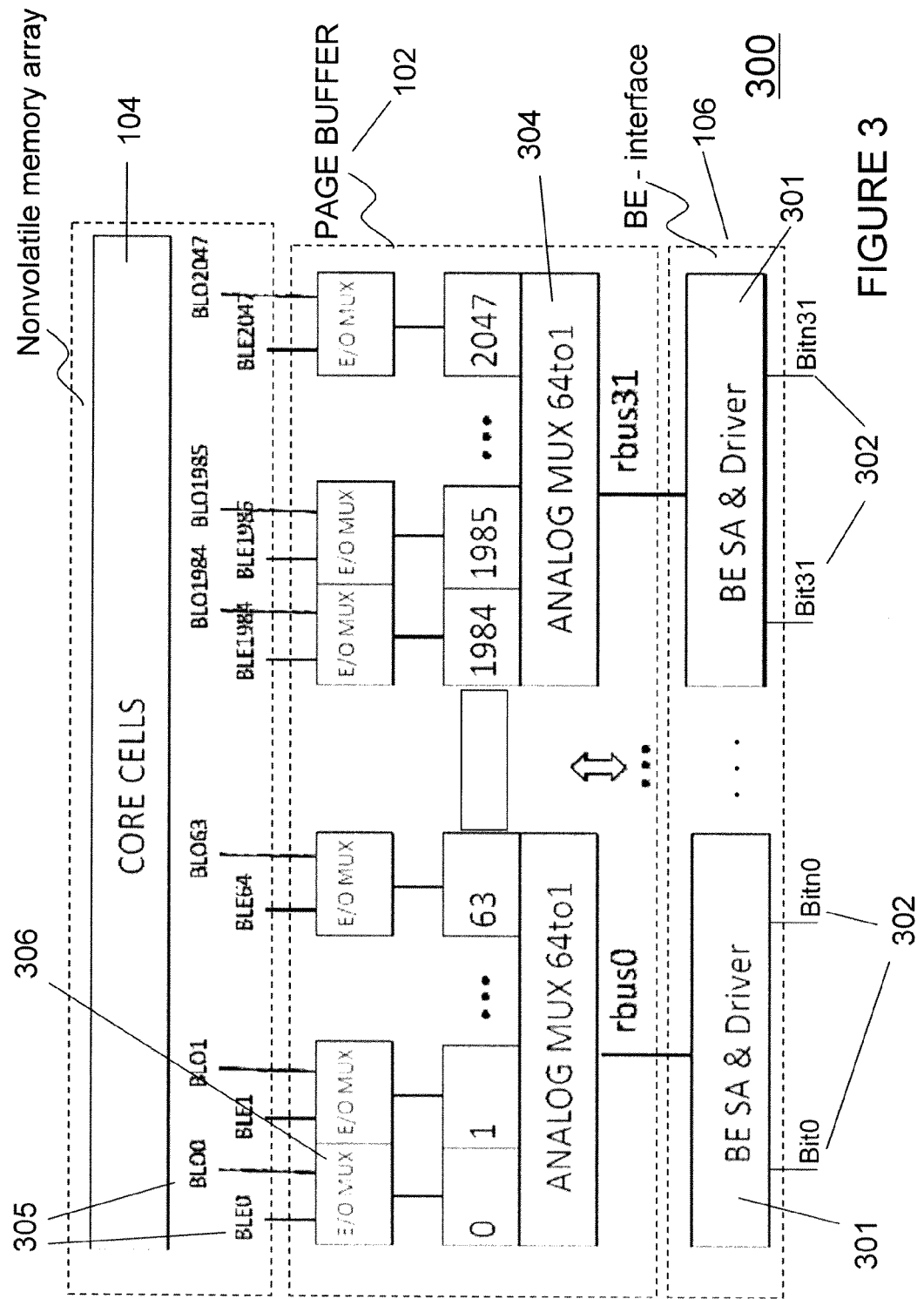
FIG. 3 shows a page buffer portion 300 of the exemplary embodiment.

The back end (BE) interface 106 (see FIG. 1) is a communication port to the page buffers 102. High parallelism and relatively low performance are required at this port. A BE sense amplifier and driving circuit 301 is implemented per each pair 302 of SRAM bit-lines. Each rbus<j> line 303 connects the SRAM to the page buffers 102 through analog mux (64-to-1) blocks 304 (as shown in FIG. 3). Finally, each page buffer 102 serves two core bit lines 305 (EVEN/ODD) using an E/O MUX block 306, as exemplarily shown in FIG. 3.

Figure 4:
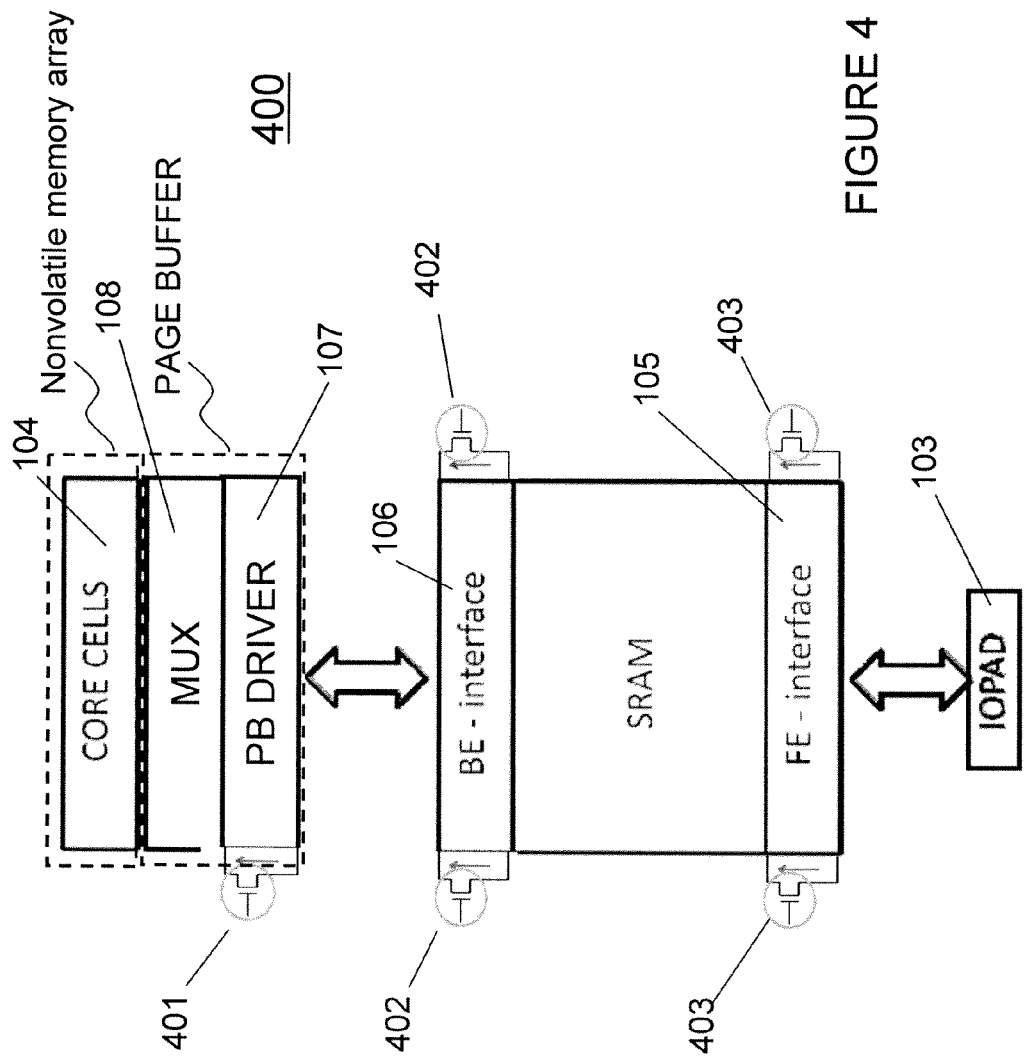
FIG. 4 shows a block diagram 400 of a DMA bypass path between an IO pad and a NAND matrix of the exemplary embodiment.

FIG. 4 exemplarily shows a block diagram 400 of a device according to the invention which expands the configuration 100 of FIG. 1 by showing a DMA bypass path, which includes a first transistor 401 coupled in parallel to PB DRIVER 107, a second transistor(s) 402 coupled in parallel to BE-interface 106, and a third transistor(s) 403 coupled in parallel to FE-interface 105. This DMA bypass path is applicable to a non-volatile memory device, and, more specifically, to a NAND flash memory device incorporating page buffer 102 and an SRAM circuit that includes SRAM 101 and BE (back end) and FE (front end) interfaces 105, 106.

Figure 5:
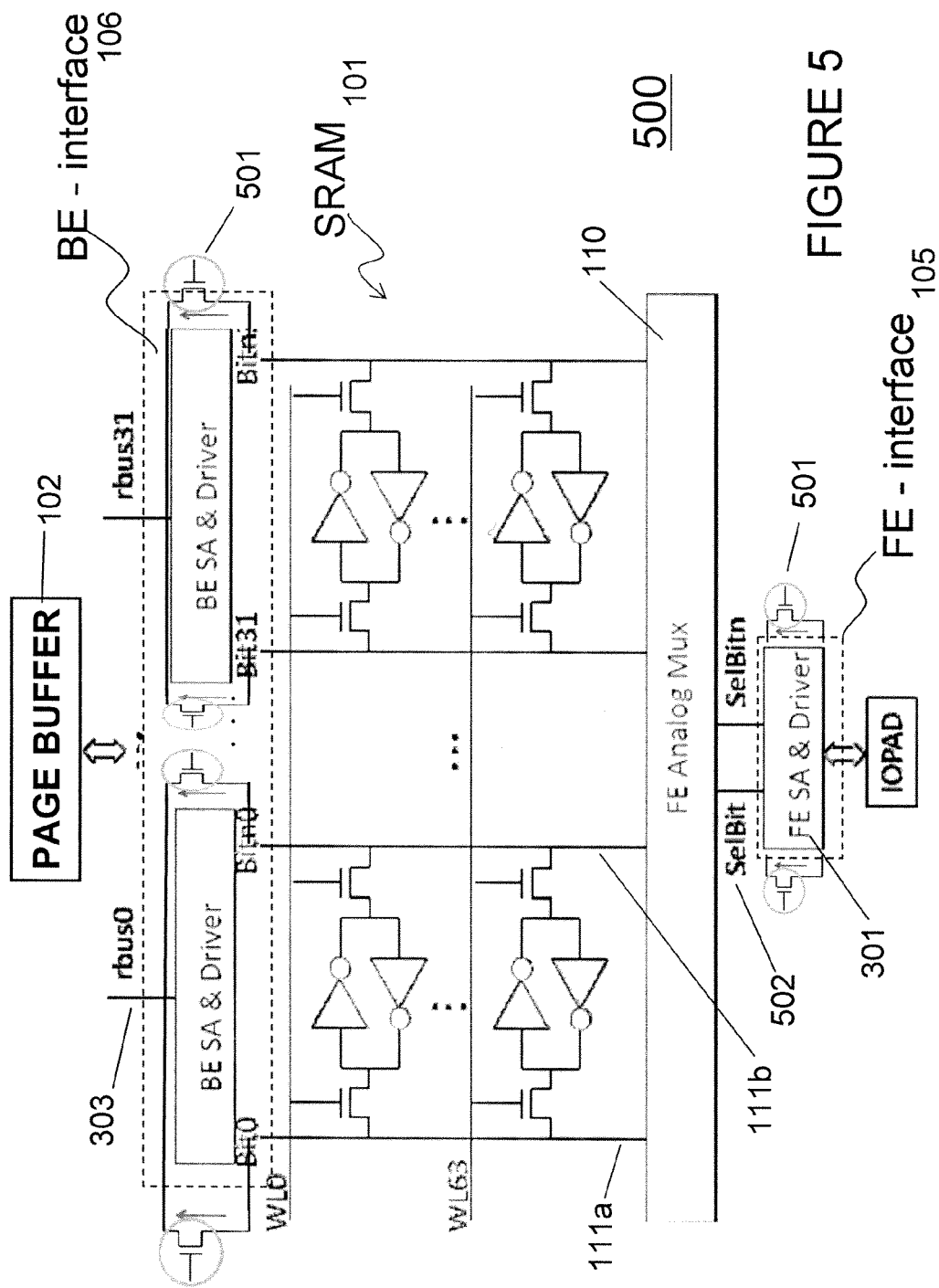
FIG. 5 shows the configuration 500 of the SRAM matrix portion with bypass transistors in front-end and back-end interfaces.
Figure 6:
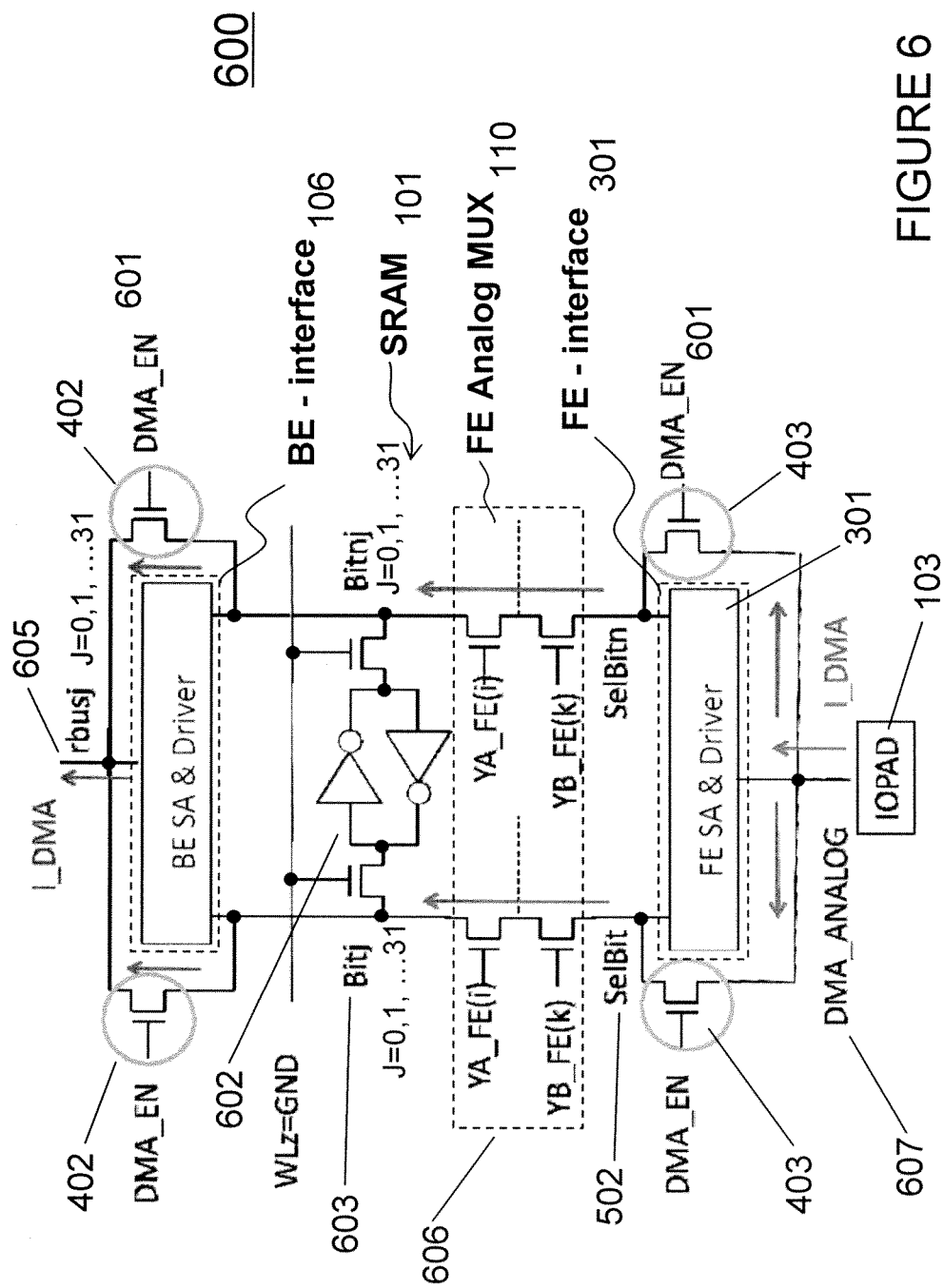
FIG. 6 corresponds to FIG. 5 and shows details 600 of a cell, bit lines <j>, and rbus <j> lines in the DMA path in the SRAM matrix.

FIGS. 5 and 6 provide additional structures/configurations 500,600, from the configurations shown in FIGS. 3 and 4, for the SRAM FE sense amplifier and driving circuits 301.

As shown in FIG. 5, SRAM 101 includes 32 pairs of bit lines 111a,111b and interfaces with the FE-interface 105 via the FE analog mux 110, and interfaces with the page buffer 102 via the BE-interface 106.

As shown in FIG. 6, the DMA_EN signal 601 interacts with the SRAM FE/BE logic to bypass the FE/BE sense amplifiers and driving circuitry 301 and to enable the SRAM word line(s) (WL) signals and the FE SRAM multiplexer and decoding logic 110.

For simplicity, in FIG. 6, cell 602, bit linej 603, bit linenj 604, and rbusj 605 represent respectively corresponding ones included in FIG. 5, such as J=0, 1, ... 31 (i.e., rbusj 605 has 32 lines total, bitj and bitnj are 32 pairs (totally 64 lines), Selbit and Selbitn 502 have two lines). FE Analog MUX 110 selects one of the pairs of bit lines Bitj 603 and Bitnj 604 in response to a select signal 606 indicated by YA_FE(i) and YA_FE(k). The selected pair of bit lines is electrically connected to the pair 502 of Selbit and Selbitn. Their true and complementary lines are coupled respectively.

Figure 7:
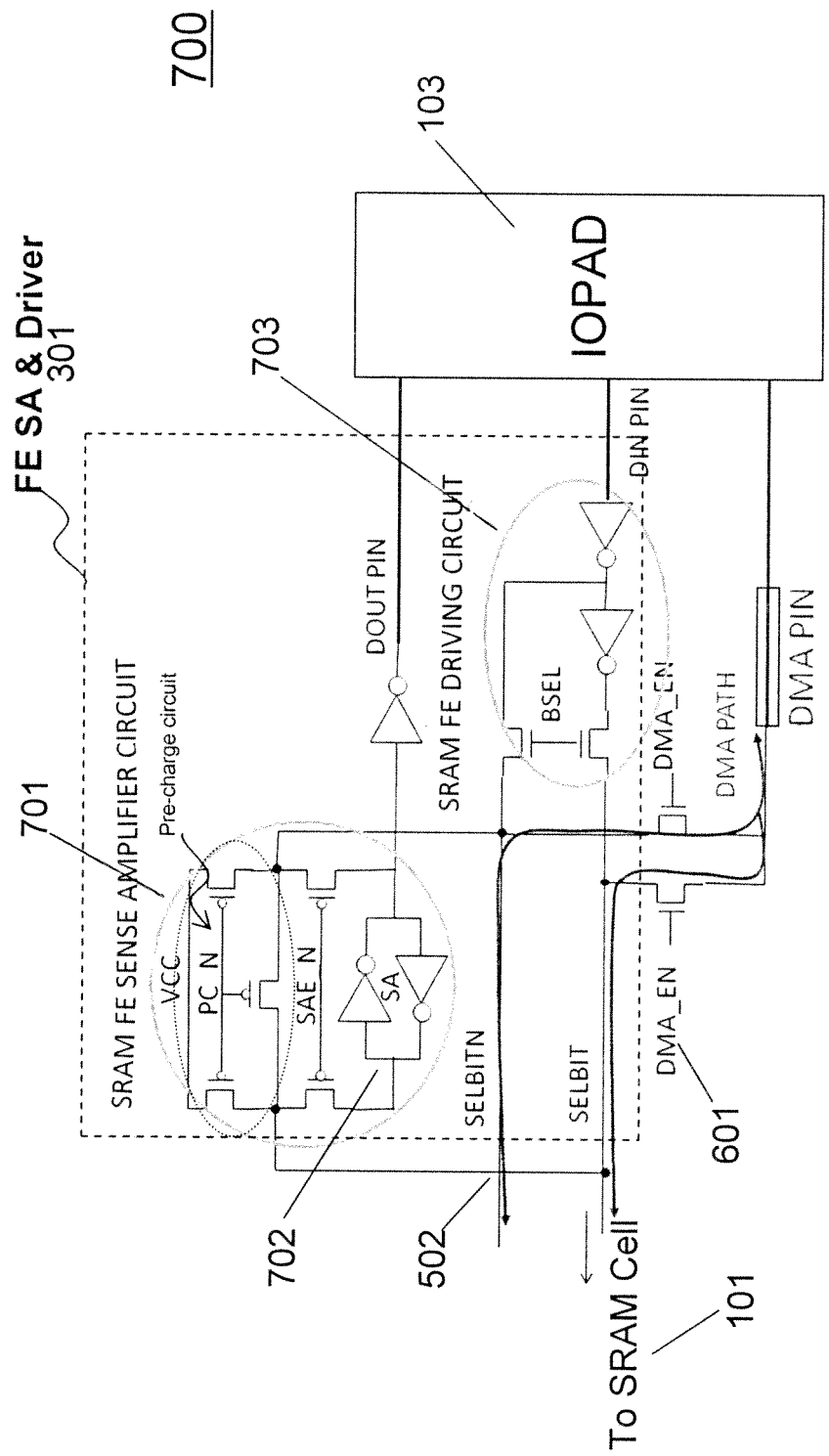
FIG. 7 corresponds to FIG. 5 and shows details 700 of the front-end interface.

As shown in FIGS. 5-7, the DMA_EN control signal 601 thereby disables the driving circuit 301, switching off BSel to GND (not shown) and the sensing structure SA is also inhibited forcing PC_N and SAE_N to VCC (not shown).

Thus, a key idea of the present invention is the reusing of the digital path to access core bit lines from the IO pad 103.

As shown in FIG. 6, DMA_ANALOG lines 607 (in parallel with digital lines) connect the IO pad 103 to the SRAM front end. Two pass transistors 403, controlled by the DMA_EN control signal, enable DMA current to bypass the FE SA and Driver blocks 301 flowing (after FE analog multiplexer 110) through a selected SRAM pair of bit lines (Bitj, Bitnj) 603, 604 until SRAM back end interface 106 is reached.

As shown in FIG. 6, another couple of bypass transistors 402 bypass BE circuitry and connect selected bit lines to the rbus line. DMA current flows through analog multiplexer 304 (64-to-1) and arrives to a single page buffer 102. In DMA mode the page buffer 107 is disabled and bypassed by transistor 401, as shown in FIG. 4. The last stage is a simple 2-to-1 analog multiplexer 306, shown in FIG. 3, to select respectively even/odd core bit lines.

The leakage current compensation in the SRAM matrix occurs during DMA mode because, by using bit lines that are paired with each other, for example Bit0 and Bitn0, it is possible to compensate leakage current from the SRAM cell. Sub-threshold current leaked from one end of the SRAM cell to one bit line_Bit0 and another sub-threshold current leaked from the other end of the SRAM cell to the other bit line_Bitn0 are the same in value as each other, but are the opposite in polarity to each other. Therefore, their total current distribution becomes substantially zero. Therefore, the DMA current to be measured at IOPAD 103 does not substantially include the leakage current occurred in SRAM.

Figure 8:
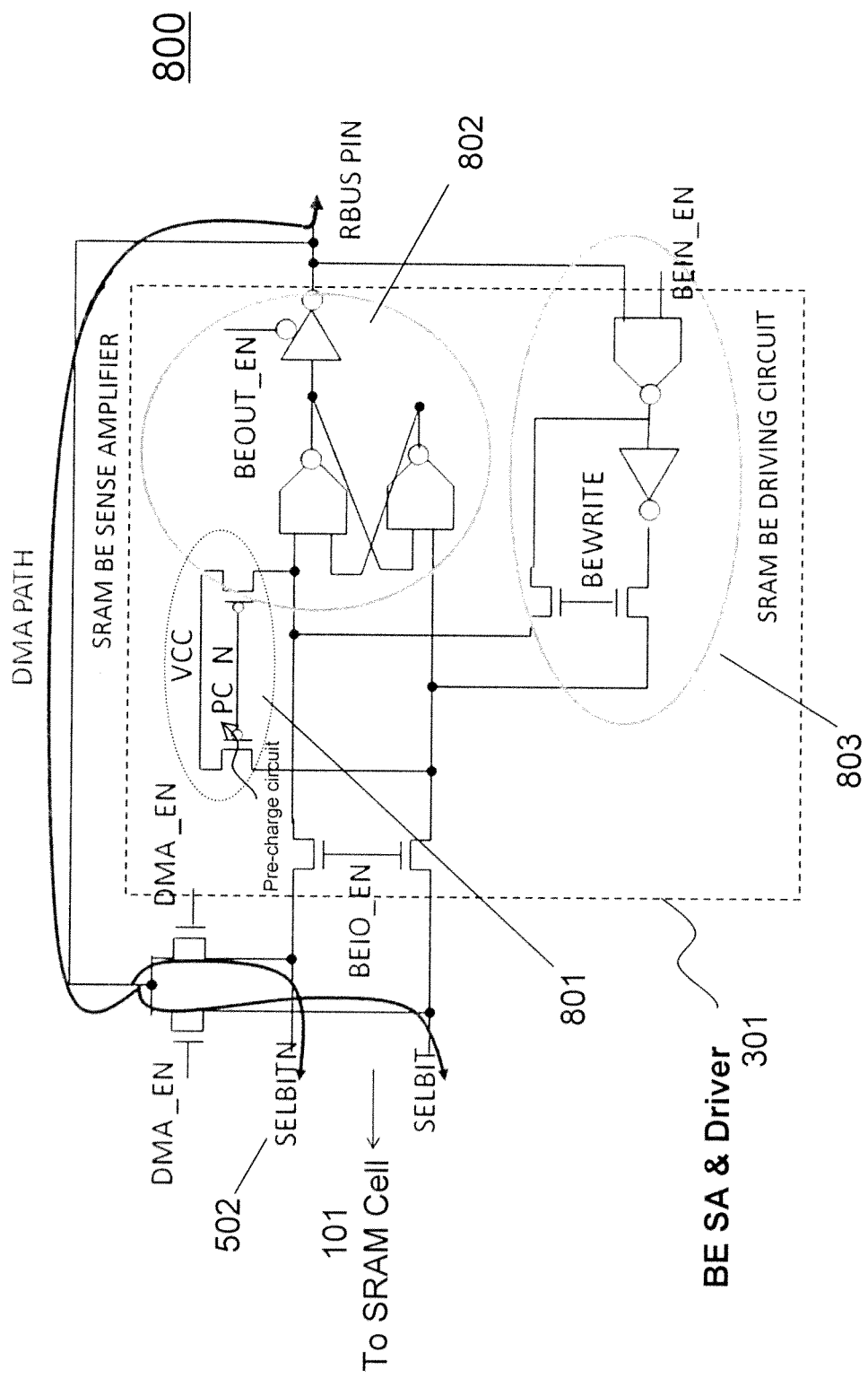
FIG. 8 shows details 800 of the back-end interface.
Figure 9:
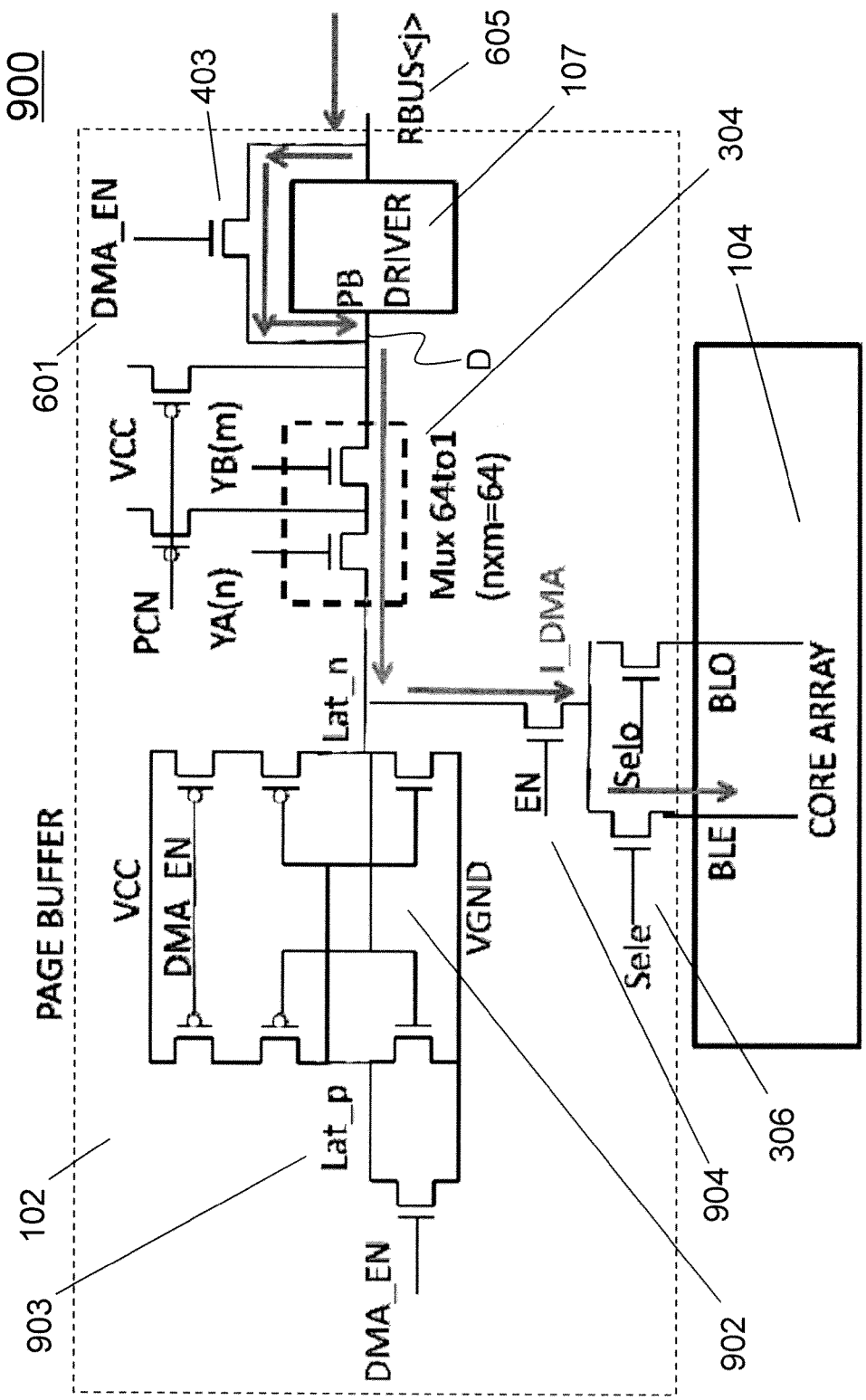
FIG. 9 shows details 900 of the page buffer.

As shown in FIG. 6 and particularly in FIG. 9, after the SRAM BE interface 301 shown in FIG. 8, the DMA current bypasses the page buffer driver (PB DRIVER) 107 through a bypass transistor 403 and reaches Latn page buffer node 901 selected by the 64-to-1 analog multiplexer 304. In the DMA mode, precharge circuit controlled by PC_N is turned off so as to not disturb the current path.

Moreover, also the page buffer latch 902 is disabled forcing Latp 903 to GND, switching off the VCC of the latch 902. In this way, the Latn node 901 is not driven from the page buffer latch 902. It is noted that all word lines are also turned off, so that all the path across the SRAM 101 is completely non-driven by internal SRAM circuits because the SRAM cells and the precharge circuits are disconnected from the bit lines. Finally, the DMA path reaches the even/odd multiplexer 306 through EN controlled transistor 904 and then the selected bit line in the core 104.

FIG. 7 shows additional details 700 of the FE SA & Driver 301 included in FE-interface 105 that is useful for explaining the differences between DMA and non-DMA modes. The non-DMA mode includes normal functioning of the flash memory device, such as write or read mode. The FE SA & Driver 301 includes pre-charge circuit 701 that is used to charge bit lines 502, SRAM FE sense amplifier circuit 702 that is used to read data from SRAM cell 101, and SRAM FE DRIVING CIRCUIT 703 that is used to write data to SRAM cell 101.

In DMA mode, DMA_EN 601 is "1" (high). PC_N and SAE_N are "1" (high), and BSEL is "0" (Low). Moreover, WLz (in FIG. 6) is 0 (GND). That is, the SRAM matrix 101 is essentially in-activated.

In non-DMA mode, such as write or read mode, these signals are described as follows.

In READ mode, DMA_EN=0 (low), BSEL=0. A pulse low of PC_N is "1" at first, then changes to "0", and further changes to "1". SAEN_N=1. By doing this, SELBIT, SELBITN=(1,1) is obtained, which means precharge and equalization are obtained. In this situation, by obtaining WORDLINE=1, SELBIT, SELBITN are changed to be one of (1,0) or (0,1), which is determined depending on the value stored into the cell. Then, SAE_N becomes "0", the value is brought to be stored into the SA Latch 702. SAE_N=1 close (i.e., finish) the read operation. Further, latched value is brought to IOPAD 103.

In WRITE mode, DMA_EN=0 (low), SAE_N=1. A pulse low of PC_N is "1" at first, then changes to "0", and further changes to "1". BSEL=0. By doing this, SELBIT, SELBITN=(1,1) are obtained, which means precharge and equalization are obtained. In this situation, by putting BSEL=1, the SELBIT, SELBITN become one of (1,0) and (0,1) depending on the input data. By putting WORDLINE=1, the values are thereby written into the SRAM cell.

Of course, the above-described logic could be reversed, as is known by one of ordinary skill in the art, taking the present disclosure as a whole.

FIG. 8 shows additional details 800 of the BE SA & Driver 301 included in BE-interface 106, and is useful for explaining differences in the BE-interface 106 between the DMA and non-DMA modes. The BE SA & Driver 301 includes a precharge circuit 801 that is used to charge bit lines 502, a SRAM BE sense amplifier circuit 802 that is used to read data from SRAM cell 101, and a SRAM BE driving circuit 803 that is used to write data to SRAM cell 101.

In the DMA mode, DMA_EN=1 (high), BEIO_EN=0, BEIN_EN=0, BEOUT_EN=0, PC_N=1, BEWRITE=0, WORDLINES=0. DMA_EN=1 allows the rbus to be connected to the SELBIT/SELBITN.

In the non-DMA mode, such as write or read mode, these signals are described as follows.

In READ mode, DMA_EN=0 (low), BEWRITE=0, BEOUT_EN=1, BEIN_EN=0, BEIO_EN=1. After a pulse low of PC_N=1→0→1, WORDLINE activates and brings SELBIT, SELBITN at (1,0) or (0,1) depending on the value stored into SRAM cell, then the value is stored into the SRAM BE SENSE AMPLIFIER, then the value is forwarded to the RBUS (output in this case) through the tri-state enabled by BEOUT_EN. Further the value is brought to be written into nonvolatile array.

In WRITE mode, DMA_EN=0 (low), BEOUT_EN=0, BEIN_EN=1, BEIO_EN=1. After a pulse low of PC_N=1→0→1, the BEWRITE=1 brings SELBIT, SELBITN at (1,0) or (0,1) depending on the RBUS (input in this case) value, and a WORDLINE=1 writes the value into the SRAM cell.

Figure 10:
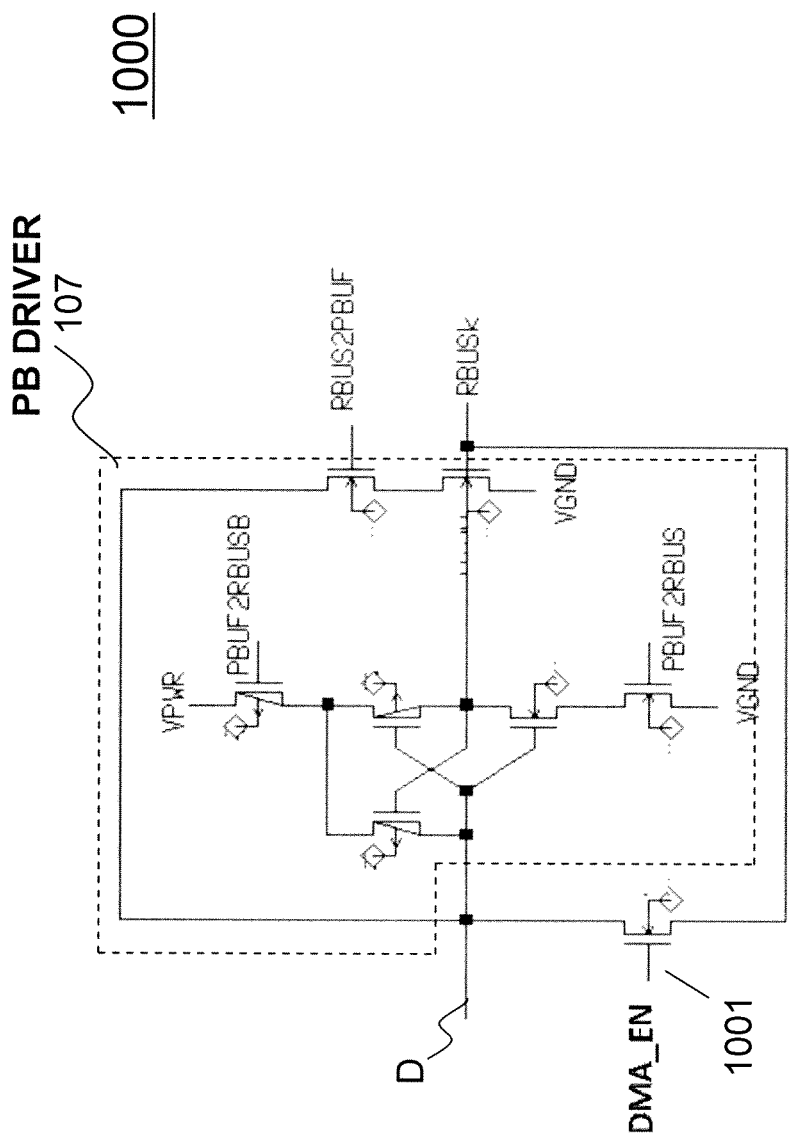
FIG. 10 shows a page buffer driver 1000.

FIG. 9 shows additional details 900 of the page buffer 102, and FIG. 10 shows additional details 1000 of the page buffer driver 107. FIGS. 9-10 are useful to explain differences between the DMA and non-DMA modes in the page buffer 102, as follows.

In the DMA mode, DMA_EN=1 (high), PBUF2RBUSB=1, PBUF2RBUS=0, RBUS2PBUF=0. DMA_EN=1 allows to connect the rbus to node D. DMA current to be measured at IOPAD is bypassed by a DMA transistor 1001 supplied with a DMA_EN signal=1.

In non-DMA mode, such as write or read mode, DMA_EN=0 (low). That is, in write mode, with DMA_EN=0, PBUF2RBUSB=1, PBUF2RBUS=0, and RBUS2PBUF=1, and, in read mode, with DMA_EN=0, PBUF2RBUSB=0, PBUF2RBUS=1, and RBUS2PBUF=0.

Figure 11A:
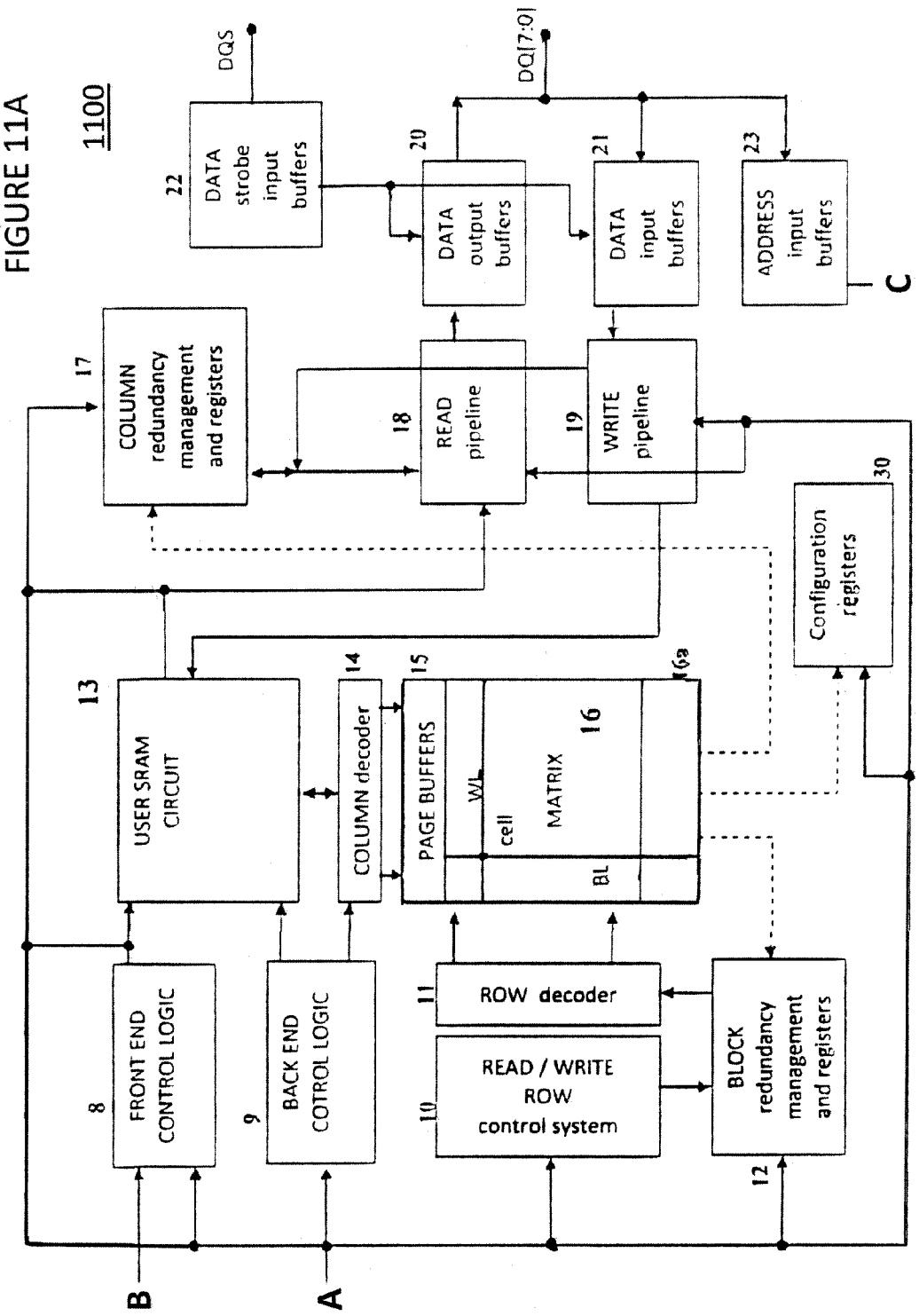
FIG. 11 shows an exemplary overall architecture 1100 for incorporating the exemplary embodiment of the present invention.
Figure 11B:
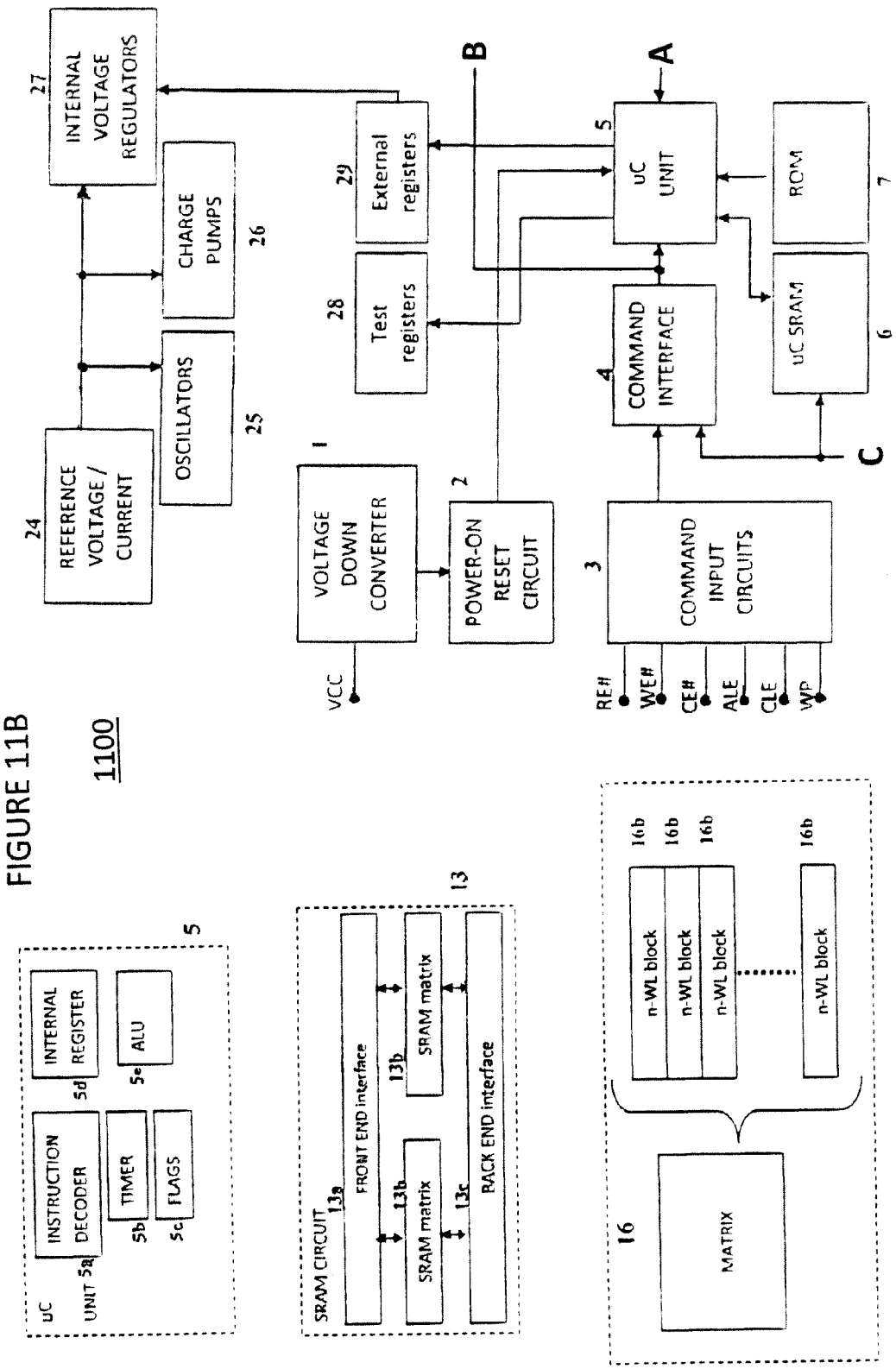

FIG. 11 shows an exemplary overall architecture 1100 of a NAND-based flash memory device incorporating the concepts of the present invention. It is noted that the upper-right dashed rectangle 16 and lower-left rectangles 5, 13 show insets of corresponding components 5, 13, and 16 of the overall architecture in the middle of FIG. 11.

On the left side, block 3 shows the I/O circuitry (input and output buffers). The signals from block 3 enter the block 4 (command interface) which is in charge of decoding command sequence (e.g., read, program, erase . . . ) and enabling the microcontroller (μC) unit 5 and the front end logic 8 to load/read into/from SRAM 13 the data pattern that will be written/read into/from the core matrix 16.

The microcontroller μC 5 executes the NAND algorithms stored in the ROM block 7. In test mode operations, the code can be also executed from the μC SRAM 6. Note that this μC SRAM 6 is different from the user SRAM 13 that is referred to extensively in the explanation of the present invention (e.g., SRAM 101 of FIG. 1).

The core matrix 16 is accessed through the row and column decoders 11,14 that properly bias the wordlines and the bitline voltages, passing through the page buffers 15. The READ/WRITE control system 10 is digitally controlled by the μC 5 and manages the analog voltages provided by the internal voltage regulator block 27 that are needed to access the NAND-based memory 16.

On the right side of FIG. 11, the output buffers 20, 22 and the related circuitry are depicted, including data input/output terminals DQ[7:0].

The User SRAM 13 is "exploded" in the box at the bottom part of the drawing. It includes a Front end interface 13a, to communicate with the front end control logic 8; a back end interface 13c, which is in charge of managing the transfer to/from the page buffers 15 through column decoder 14; and two memory matrices 13b (if a multi-level architecture is used, otherwise, there will be only one matrix block 13b).

The present invention involves particularly the following blocks USER SRAM CIRCUIT 13 (e.g., SRAM 101 of FIG. 1), COLUMN DECODER 14 (e.g., MUX 108 of FIG. 1, PAGE_BUFFERS 15 (e.g., PB DRIVER 107 of FIG. 1), and NAND matrix 16 (e.g., CORE CELLS 104 of FIG. 1). The details of how these blocks and other interfacing blocks were described in the descriptions explaining the concepts of the present invention, including the DMA and non-DMA modes of operation.

Hereinabove, the entire DMA current path has been described in detail. As described, in the present invention, the driving voltage at the IO pad may be propagated to the selected cell of the NAND core to measure the current or bit line leakage. Any other driving circuit along the DMA path may be de-asserted in DMA mode.

An exemplary feature of the present invention includes the full reuse of digital structures to access the core, with no extra area impact and minimum extra digital control. The exemplary embodiment was applied to a 32 nm MLC (multilevel cell) 32 Gbit NAND memory device, but the present invention could clearly be implemented in other configurations and variations.

While the invention has been described in terms of a single exemplary embodiment, those skilled in the art will recognize that the invention can be practiced with modification within the spirit and scope of the appended claims.

Further, it is noted that, Applicants' intent is to encompass equivalents of all claim elements, even if amended later during prosecution.

What is claimed is:

1. A device comprising:
   a memory circuit including a memory cell and a bit line coupled to the memory cell;
   a first node;
   a first interface circuit coupled between the first node and the bit line of the memory circuit and including a first sense circuit that senses data stored in the memory cell to drive the first node;
   a second node;
   a second interface circuit coupled between the second node and the bit line of the memory circuit and including a second sense circuit that senses the data stored in the memory cell to drive the second node; and
   a first transistor coupled in parallel to the first interface circuit to form, when rendered conductive, a first bypass path between the bit line of the memory circuit and the first node.

2. The device according to claim 1, further comprising a data pad provided to communicate with an outside of the device, and the first node is electrically connected to the data pad.

3. The device as claimed in claim 2, further comprising a nonvolatile memory circuit including a nonvolatile memory cell and a bit line, the first node being selectively connected operatively to the bit line of the nonvolatile memory circuit.

4. The device as claimed in claim 3, further comprising a buffer circuit inserted between the bit line of the nonvolatile memory circuit and the first node.

5. The device as claimed in claim 1, further comprising a second transistor coupled in parallel to the second interface circuit to form, when rendered conductive, a second bypass path between the bit line of the memory circuit and the second node.

6. The device according to claim 5, further comprising a data pad communicating with an outside of the device and a nonvolatile memory circuit including a nonvolatile memory cell and a bit line, the first node being electrically connected to the data pad, the second node being selectively connected operatively to the bit line of the nonvolatile memory circuit.

7. The device as claimed in claim 6, further comprising a buffer driver circuit inserted between the bit line of the nonvolatile memory circuit and the second node and a third transistor coupled in parallel to the buffer driver circuit to form, when rendered conductive, a third bypass path between the second node and the bit line of the nonvolatile memory circuit.

8. The device as claimed in claim 1, wherein the first interface circuit further includes a first driving circuit that writes a data signal of the first node into the memory cell, and each of the first sense circuit and the first driving circuit is deactivated when the first transistor is rendered conductive.

9. The device as claimed in claim 5, wherein the second interface circuit further includes a second driving circuit that writes a data signal of the second node into the memory cell, and each of the second sense circuit and the second driving circuit is deactivated when the second transistor is rendered conductive.

10. The device as claimed in claim 1, wherein the memory cell comprises a static random access memory (SRAM) cell including a pair of input/output nodes, one of which is connected to the bit line and the other of which is connected to an additional bit line, and the device further comprises a second transistor coupled in parallel to the first interface circuit to form, when rendered conductive, a second bypass path between the additional bit line of the memory circuit and the first node.

11. The device as claimed in claim 1, further comprising:
    a nonvolatile memory cell array including an input/output node that is electrically coupled to the second node;
    a buffer memory electrically connected to the input/output node of the nonvolatile memory cell array; and
    at least one second transistor disconnecting the buffer memory from the input/output node of the nonvolatile memory cell array when the first transistor is rendered conductive.

12. A device comprising:
    a nonvolatile memory array;
    a Static Random Access Memory (SRAM) array including a plurality of bit lines including first and second bit lines paired with each other;
    a first circuit coupled between the nonvolatile memory array and the first and second bit lines, and configured to interface with the SRAM array;
    a pad;
    a second circuit coupled between the pad and the first and second bit lines, and configured to interface with the SRAM array; and
    a control circuit configured to perform a first operation to access the nonvolatile memory array via the SRAM array and the first and second circuits, and to perform a second operation by producing an electrical path connecting the pad to the nonvolatile memory array through at least one of the first and second bit lines of the SRAM array, without intervening at least one of the first and second circuits.

13. The device as claimed in claim 12, wherein the control circuit is configured to perform the second operation by producing an electrical path connecting the pad to the nonvolatile memory array through both of the first and second bit lines of the SRAM array.

14. The device as claimed in claim 12, further comprising:
    a page buffer driver inserted between the nonvolatile memory array and the first circuit to interface therebetween; and
    a DMA transistor coupled in parallel to the page buffer driver,
    wherein the control circuit is configured to perform a third operation to access the nonvolatile memory via the page buffer driver, and to perform a fourth operation by producing an electrical path connecting the pad to the nonvolatile memory array through the DMA transistor, without intervening the page buffer driver.

15. The device as claimed in claim 14, further comprising a latch circuit coupled to the nonvolatile memory array, and configured to latch data that is read from the nonvolatile memory array, the latch circuit further configured to be inactive in the fourth operation that the control circuit performs.

16. A device comprising:
    a nonvolatile memory cell;
    a bit line coupled to the memory cell;
    a page buffer coupled to the bit line;
    a Static Random Access Memory (SRAM) coupled to the page buffer;
    a terminal coupled to the SRAM; and
    a circuit configured to provide a current path between the bit line and the terminal via a portion of a wire included in the SRAM under a condition where the SRAM is inactivated.

17. The device as claimed in claim 16, wherein the circuit includes a first transistor comprising a source-drain path coupled between the terminal and the portion of the wire of the SRAM and a control gate supplied with a control signal.

18. The device as claimed in claim 17, wherein the circuit further includes a second transistor comprising a source-drain path coupled between an internal node and the portion of the wire of the SRAM, and a control gate supplied with the control signal, the internal node being inserted between the SRAM and the page buffer and being coupled to the SRAM and the page buffer.

19. The device as claimed in claim 18, wherein the circuit further includes a third transistor comprising a source-drain path coupled between the bit line and the internal node and a control gate supplied with the control signal.

20. The device as claimed in claim 19, wherein the portion of the wire comprises one or ones of bit lines included in the SRAM.

* * * * *